United States Patent

Evans

[15] 3,662,270

[45] May 9, 1972

[54] VHF/UHF INTERLOCK CIRCUIT

[72] Inventor: Wayne Wheeler Evans, Indianapolis, Ind.

[73] Assignee: RCA Corporation

[22] Filed: July 16, 1969

[21] Appl. No.: 842,179

[52] U.S. Cl. ..............................325/390, 325/459, 325/461, 325/464, 334/11

[51] Int. Cl. ..........................................................H04b 1/16

[58] Field of Search..................325/390, 391, 392, 393, 394, 325/461, 458, 459, 464, 419, 422; 334/11, 14, 15

[56] References Cited

UNITED STATES PATENTS

| | | | |
|---|---|---|---|
| 2,069,127 | 1/1937 | Beers | 325/390 |
| 1,967,816 | 7/1934 | Fuchs | 325/394 |
| 3,508,176 | 4/1970 | Labude et al. | 325/459 X |

*Primary Examiner*—Benedict V. Safourek
*Attorney*—Eugene M. Whitacre

[57] ABSTRACT

In a television receiver having an electronically controlled tuner, a circuit for automatically tuning the receiver to a particular one of the channels, when, for any reason, the electronic tuning system is disconnected from the receiver.

8 Claims, 2 Drawing Figures

INVENTOR

Wayne W. Evans

BY H. Christoffersen

ATTORNEY

INVENTOR
Wayne W. Evans

BY H. Christoffersen
ATTORNEY

VHF/UHF INTERLOCK CIRCUIT

BACKGROUND OF THE INVENTION

A television receiver whose tuning is electronically controlled, has a number of operating advantages. These include, among others, a greater degree of automation and speed in the selection of channels and less noise when changing channels. However, where the only means possible for channel selection is a single electronic tuning system, a failure in its operation may prevent any reception.

One partial solution to the problem is to provide two electronic tuning systems, one for UHF (ultra high frequency) and the other for VHF (very high frequency), which are independent of each other. This makes it possible, in the event of failure of one of these systems, to continue to receive signals on the other system. However, in the system of the present application, for reasons not necessary to discuss here, a portion of the VHF tuner is used for UHF reception so that this solution becomes impractical. Moreover, two separate electronic systems would substantially increase the price of the receiver.

It is an object of this invention to provide, in a system having a single electronically controlled tuning system a circuit for permitting continued signal reception over at least a portion of the television spectrum, should the electronic tuning system be disconnected as, for example, when it becomes inoperative and requires servicing.

SUMMARY OF THE INVENTION

The combination in a television receiver of means for electronically tuning the receiver, and means responsive to the physical disconnection of the latter from the remainder of the receiver for automatically tuning the receiver to a particular channel in the receiver.

DETAILED DESCRIPTION

Figure 1:
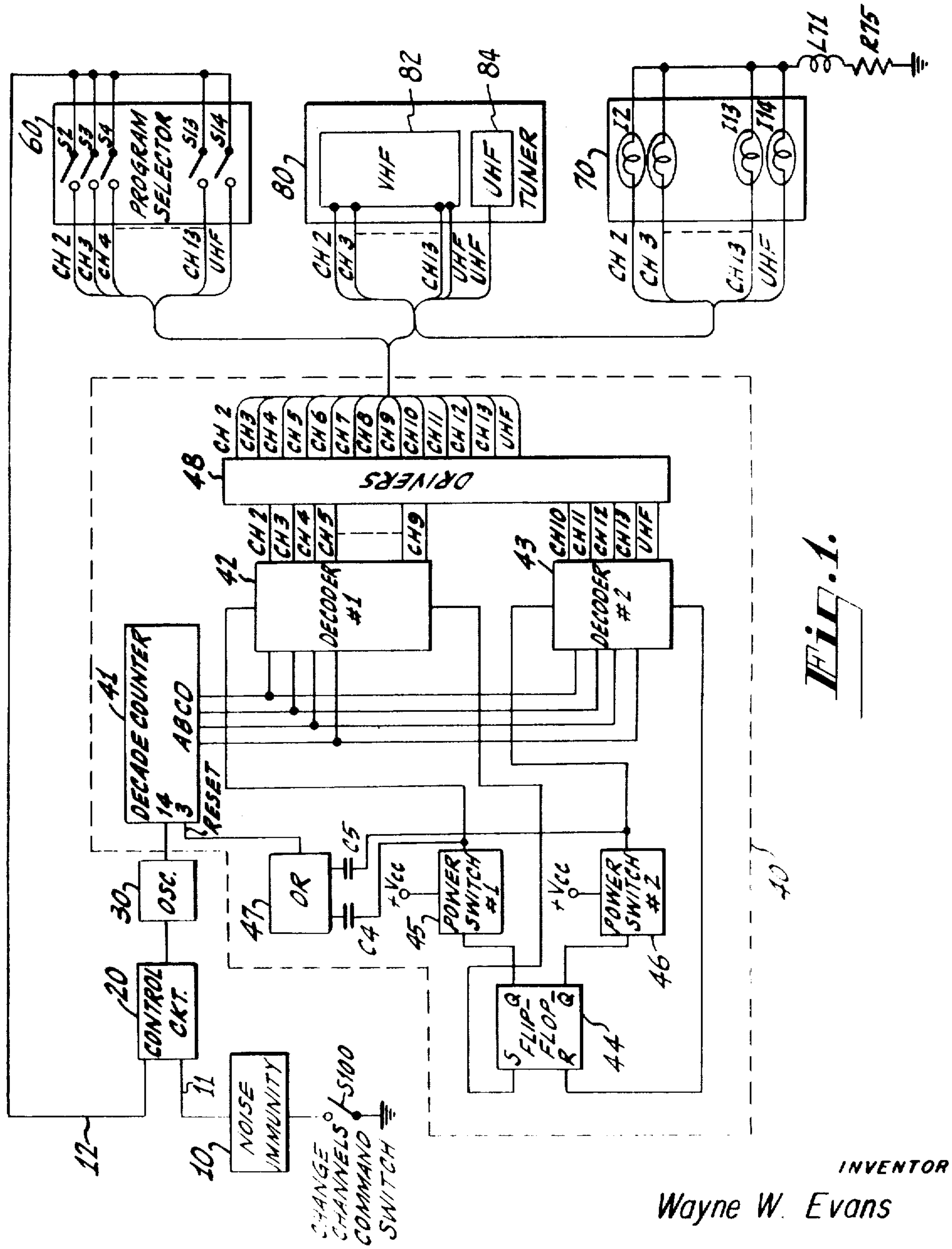
FIG. 1 is a block diagram of a television system in which the invention is used.

In the system of FIG. 1, the tuner 80 and in conjunction therewith the bank of indicator lamps 70 and the bank of program selector switches 60 are electronically controlled. Each signal applied to a channel of the tuner is also applied to the indicator lamp corresponding to that channel and to the program selector switch corresponding to that channel.

The tuner section 80 shown in FIG. 1 includes a VHF section 82 and a UHF section 84. The VHF tuner has 13 terminals, 12 corresponding to the 12 channels 2 to 13 and the 13 th terminal for UHF. In the preferred embodiment, the VHF tuner has 12 tuned circuits (not shown) each of which is coupled to a different one of the 12 terminals. It should be noted that the VHF tuner could, for example also comprise a single circuit which could be tuned to different frequencies by means of different voltage levels applied to the various terminals. In the preferred embodiment however, each of the 12 tuned circuits is individually and separately selected when a signal of sufficient amplitude is applied to its tuner terminal. Since a potential applied to one of the terminals causes the video information of the channel coupled thereto to be displayed, it is clear that only one terminal may receive such a potential at any one time.

The UHF tuner 84 is treated for the purpose of this application as another channel and may be selected like any of the VHF channels. However, as there are a great many stations in the UHF region, in the particular embodiment chosen for illustration, UHF station selection is achieved by means of an additional continuous control (not shown) which tunes the receiver to those UHF stations in conventional fashion. It is to be understood of course, that the UHF tuner can instead be treated like the VHF tuner, that is, it may have a plurality of input terminals, each corresponding to a different UHF station, and tuner electronically in the same manner as the VHF channels, as discussed below.

Corresponding to each channel there is a program selection switch. These switches (S2 through S14) are closed in advance by the viewer, for example when the set is first installed or even just before sitting down to view several television programs on different channels, to the channels he desires automatically to be selected and displayed. These switches, when closed, provide a path for a feedback signal which stops the receiver at the preselected channels.

Corresponding to each channel there is also an indicator lamp. These indicator lamps (I2 through I14) are lit whenever the corresponding channel is displayed.

The tuner 80, the program selector switches 60 and the bank of indicator lamps 70 are operated in parallel, but it should be obvious that they could also have been operated in series, or partly in series and partly in parallel the only criteria for the mode of operation being reliability and ease of connection and assembly.

In the operation of the system in response to a viewer generated command to change channels, the receiver passes the channels not of interest, without displaying them, and stops only when it reaches the next preselected channel. The means for accomplishing this includes a sequencing means comprising the oscillator 30 and the associated counting circuits, and which in response to the change channel command sequentially energizes, one at a time, a tuner terminal and the corresponding channel coupled thereto. When a channel which has been preselected is reached, that is, when a pulse is applied to the tuner terminal for a channel whose program selector switch is closed, a feedback signal is produced which prevents the sequencing means from advancing to the next channel, so that the preselected channel is displayed.

The change-channel switch S100, which is activated by the viewer whenever he wants to change channels, is connected to a noise immunity and pulse shaping circuit 10. The noise immunity circuit removes contact bounce generated by the switch closure and in response to a switch closure of given duration provides a single relatively smooth "start oscillation" pulse on line 11 which is fed to control section 20. The control section 20, when energized by the "start oscillation" pulse, allows pulses from oscillator 30 to be fed to a decade counter represented by block 41. Once enabled, the oscillator supplies pulses to counter 41 until a feedback pulse is applied to line 12 inhibiting the further application of pulses to the counter.

The decade counter is part of the counting means 40 whose function is to provide, in response to pulses from the oscillator, output signals which are capable of sequentially energizing the channels of the tuner 80 as well as the corresponding lines connected to the program selector switches 60 and to the bank of indicator lamps 70.

Figure 2:
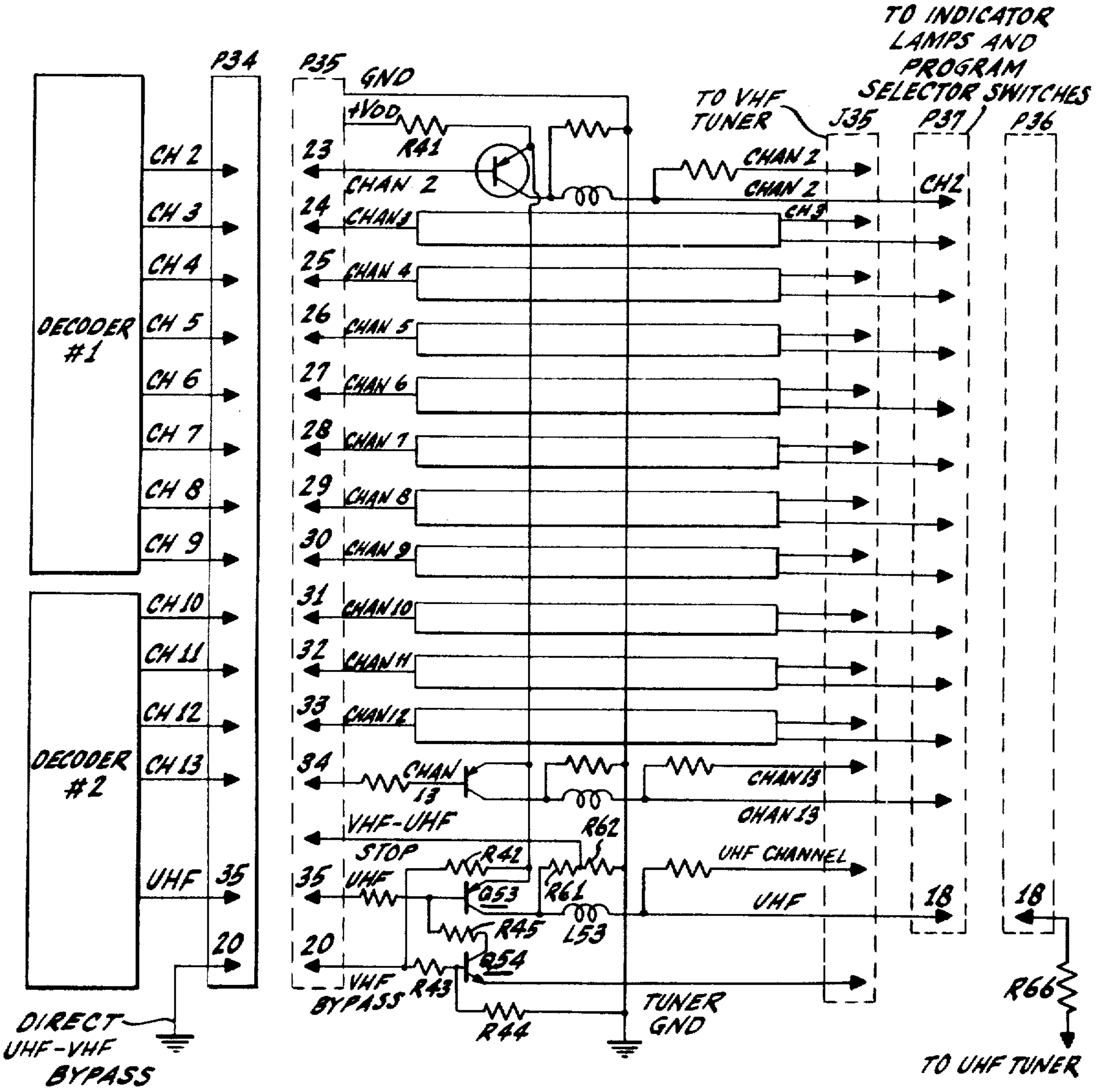
FIG. 2 is a schematic diagram of a circuit embodying the invention.

The counting means therefore may be a shift register, a ring counter or other means suitable for generating pulses in a sequential order. However, to minimize components and power and to use presently available integrated circuits the combination shown in FIG. 1 and further detailed in FIG. 2 is used. The counter 41 is wired to provide 10 counts (0 – 9) in binary coded decimal (BCD) format. The counter has four outputs denoted by the letters A, B, C, and D having, respectively, the weights of 1, 2, 4, and 8. The counter is automatically reset after the tenth count or by a pulse from the output of "OR" gate 47. The counter's four outputs are fed in parallel by decoder 1, represented by block 42, and decoder 2, represented by block 43. Decoders 1 and 2 are well known binary-coded-decimal to decimal converters (BCD to decimal decoders). Each decoder has 10 outputs and each decoder output uniquely represents one count of the 10 counts.

It should be noted that each decoder is returned by means of a power switch to the $V_{CC}$ line. Thus, decoder 1 is coupled to $+V_{CC}$ by power switch 1 represented by block 45 and decoder 2 is coupled to $V_{CC}$ by power switch 2 represented by block 46. Power switch 1 receives the $\overline{Q}$ output of flip-flop 44 and power switch 2 receives the complementary output $\overline{Q}$ of the flip1flop 44. The decoder 42 connects to the set terminal S of the flip-flop and decoder 43 connects to the reset terminal R of the flip-flop. The power switches 1 and 2 are AC coupled by capacitors C4 and C5 to "OR" gate 47. This ensures that every time power switch 1 or power switch 2 is energized, a reset pulse is fed to the counter, resetting the latter to its zero count.

The operation of the counting means is best understood by first assuming that the set-reset flip-flop 44 is reset (i.e., Q is "-high" and Q is "low") so that power switch 1 is turned on and power switch 2 is not energized. Under these conditions, decoder 1 has power applied thereto while decoder 2 has no power applied thereto.

Pulses applied to counter 41 cause signals to appear on lines A, B, C, and D, which are decoder by decoder 1 and appear as sequentially spaced pulses on its output lines. (note that only eight decoded outputs are needed to produce the control signals for channels 2 through 9. In other words, the eight counts 0000,0001 - 0111, produced in response to the reset pulse, which produces count 0000, and seven pulses following the reset pulse, correspond to the decoder outputs for channels 2 through 9 respectively.) When decoder 1 decodes the ninth count (1000) from the counter (in response to the eighth input pulse following the reset pulse) it sets the flip-flop forcing Q to go low and $\overline{Q}$ to go high. This, in turn, removes power from decoder 1 and applies power to decoder 2. Simultaneously, in response to $\overline{Q}$ going high, a reset pulse is fed to the decade counter via OR gate 47, resetting the latter. The counter output is now decoded by decoder 2 which is also capable of providing 10 output pulses. (note that when the counter is reset and decoder 2 is energized, the initial position of the counter corresponds uniquely to the decoded output for channel 10.) Since only five of the 10 outputs from decoder 2 are necessary to energize the remaining five tuner channels, the flip-flop is reset after the fifth count out of decoder 2.

It should be noted that the last count decoded by the first decoder before the second decoder is gated on and the counter is reset is the count of nine and that the last count decoded by the second decoder before the first decoder is gated on is the sixth count. It should be clear that these were arbitrarily chosen and that generally the last count decoded by the decoders may be any of the counts from 1 through 10.

By using alternately gated power switches to apply power to the two decoders, it is possible to obtain 2N decoded outputs from a counter arranged to have N counts, where N is an integer greater than 1. The decoder outputs operated at a $+V_{CC}$ level which is typically 5 volts are coupled through buffer stages represented by block 48 which level shifts the signals to a $+V_{DD}$ level which is typically 30 volts. There are 13 buffer stages and each output of a buffer stage drives a channel of the tuner, and corresponding to that channel an indicator lamp and a program selector switch.

The automatic selection process provided by the system may now be explained by an example in which it will be assumed that the viewer wishes to see only channel 2 or channel 13. Switch S2 and switch S13, corresponding to channels 2 and 13 respectively are closed, and the remaining switches are kept open. It will be further assumed that prior to depressing switch 1, power is present and channel 2 is being displayed. Activating switch S100 causes the control section to enable the oscillator, which supplies pulses to the counter. After the first pulse, the counter, which was at the counter position corresponding to channel 2, advances by one count. This generates a pulse at the output marked channel 3 of the decoder 1. Since power has been removed from the line corresponding to channel 2, indicator light I2 goes off. Channel 3 is momentarily energized. However, as its program selector switch S3 is open, no signal is fed back to the control section. Therefore, the oscillator continues to operate, and its next output pulse causes the counter to advance by 1. The pulse is removed from the channel 3 terminal of the decoder 42 and the new count causes a pulse to be applied at its channel 4 terminal.

As the duration of the pulse applied to the channel 3 terminal is short, and as an inductive network is connected in series with the lamps to slow their response, the indicator light for channel 3 does light up with sufficient intensity or for a sufficient length of time to be visible to the viewer. As for the audio and video signals of the momentarily energized circuits, a muting circuit, described later, prevents audio and video display while the oscillator is enabled.

The oscillator continues to provide pulses to the counter which are decoded by decoder 1 until channel 9 is reached and which are then decoded by decoder 2 until channel 12 is reached. The next pulse causes the channel 13 terminal to be energized. As the corresponding selector switch S13 is closed, a feedback pulse is applied via line 12 to the control circuit 20. This pulse disables the oscillator and prevents the further application of pulses to the counter. The counter is thus stopped at the count corresponding to the decoded output which is fed to the channel 13 line. The tuned circuit corresponding to channel 13 is turned on, indicator lamp I13 corresponding to channel 13 is on and remains on so long as S100 is not again activated.

The outputs of the decoders are coupled to the inputs of the drivers shown in FIG. 2. Each decoder output is terminated in connector P34 which also has a grounded pin 20. Connector P34 mates with matching connector P35 to which the inputs of the drivers are connected. Thus, each driver input is connected to a different one of the decoder outputs. In practice, the drivers are mounted on a board which contains 12 identical circuits for channels 2 through 13 and a thirteenth circuit which, though similar to the others, is modified to provide interlock for the UHF channel. The drives serve to buffer the decoders from the load and primarily act to level shift the sequencing signals since the tuner is operated at $+V_{DD}$ which is typically 30 volts while the logic circuits are operated at $+V_{CC}$ which is typically +5 volts. Each of the twelve identical circuits includes a PNP transistor having a base, an emitter, and a collector. The emitters of the driver transistors are connected in common and through a low resistance R41 to the terminal for voltage $+V_{DD}$. The base of each transistor is returned through a current limiting resistor to its corresponding decoder output. Each collector is connected to one terminal of a ground return resistor and to one side of an inductor. The other side of each inductor for channels 2 through 13 feeds in parallel a resistor which couples the driver output to a tuned circuit of the VHF tuner and its respective indicator lamp circuit and program selector switch.

A decoder output stage, when energized, provides a path for the base current of the corresponding driver causing the driver transistor to saturate and effectively providing a signal of $+V_{DD}$ amplitude at its collector. Thus, corresponding to a ground signal at one of the decoder outputs, a 30 volt pulse is applied to the corresponding channel line going to the load section.

The UHF channel driver contains more components than the other drivers to enable the UHF channel to be energized if and when any errors in the control, the oscillator or the counter circuit requires the removal of the VHF control board containing that circuit. The UHF driver includes, as do the other drivers, a PNP transistor (Q53) having a collector, base, and emitter. The emitter of Q53 is returned in common with the emitters of the other driver transistors. The base of Q53 is also returned as are the other drivers through a resistor to its corresponding UHF decoder output. The collector of UHF driver Q53 is coupled as are the other drivers through a choke to the VHF tuner and in addition as shown in FIG. 2 by means of pin 18 of connectors P37 and P36 to the UHF tuner. The UHF driver is also coupled to its corresponding UHF program selector switch S14 shown in block 60 of FIG. 1 and to the UHF indicator lamp I14. The collector of Q53, in contrast to the other drivers, is connected through two series resistors R61 and R62 to the tuner ground. The junction of the two resistors is connected to a line labeled VHF to UHF STOP which feeds back a positive signal to the control circuit stopping the counter at the UHF position.

The additional circuitry which turns the UHF driver on when the VHF control board is removed, includes NPN transistor Q54 having a base, emitter, and collector. The collector of Q54 is returned through resistor R45 to the base of Q53 while its emitter is connected to ground. The base of transistor Q54 is returned through resistors R43 and R42 to the common emitter point of the driver transistors. The base of Q54 is normally connected to ground by means of the interconnecting pin 20 of plug P35 connected to grounded pin 20 of plug P34. When plug P34 is removed, the base of Q54 is driven positive by means of resistors R42 and R43 which causes transistor Q54 to conduct. Q54 draws base current from Q53 driving the latter into saturation. With Q53 saturated, the UHF channel is energized and will be displayed until plug P34 is again mated to plug P35, at which point Q54 is cut off, its base being held close to ground potential.

Reviewing the salient features of the invention, it has been shown that in the control system described in FIG. 1, the VHF control circuit contains the counter which is used to sequence from channel-to-channel and that one of these channels is the UHF position. Removal of the VHF control also disables the sequencing system. With the sequencing control system removed, the channel drivers shown in FIG. 2 which couple the decoded outputs to the respective tuner inputs are turned off and can no longer provide any control signals thereto. With the counting and control means disabled, none of the channels may be selected since the selection means is disabled.

To maintain a degree of reception, a UHF interlock circuit has been provided to provide UHF reception when the VHF control board is removed. The interlock circuit, when energized, puts the system in the same position it would be if the change-channel switch had been used to select the UHF channel.

The basic requirements met by the interlock switch are:

1. The interlock switch is disabled when the VHF counter board is plugged in. Thus, when the VHF board is plugged in, normal counting and sequencing are not affected.

2. The interlock is enabled immediately upon the removal of the VHF board.

3. Upon reinsertion of the VHF board, the interlock is again disabled removing its effect upon the normal operation of the system.

In the example of the invention discussed above, the interlock circuit is connected in a manner to select the UHF channel. This is done because of the many stations available in the UHF range. It should be clear, however, that the interlock circuit may instead be coupled to any one of the VHF channels which the viewer (or manufacturer) wishes to select for display when the electronic controls are disabled and its control circuit disconnected from the receiver. The connection could be achieved by connecting the collector of Q54 to the base of the driver corresponding to the channel selected to be displayed in the event of a failure of the electronic control circuitry.

WHAT IS CLAIMED IS:

1. The combination of:

a television receiver having a first plurality of channels;

an electronic control system detachably connected within said receiver for electronically switching the tuning of said receiver from one to another channel of a group of said channels; and means responsive to the physical disconnection of said control system from the remainder of said receiver for automatically tuning said receiver to a particular one of said channels.

2. The combination of claim 1, wherein said particular one of said first plurality of channels is associated with tuning said receiver to a second plurality of channels and wherein said receiver includes means for manually tuning to any of said second plurality of channels.

3. The combination as set forth in claim 2, wherein said first plurality of channels comprises a plurality of VHF channels, and said second plurality of channels comprises a plurality of UHF channels.

4. The combination of:

a television receiver having a plurality of channels which are selectively tuned by means of control signals applied to a plurality of terminals, each terminal corresponding to a different channel;

a plurality of drivers, each driver having an output coupled to a different one of said terminals and an input, each one of said drivers generating a control signal at its output adapted to tune the receiver to its corresponding channel in response to a signal applied at its input;

an electronic control system including sequencing means having a plurality of output lines, each output line corresponding to a different channel, said sequencing means suitable for generating a pulse on successive output lines;

connector means for detachably connecting each of said sequencing means output lines to a different one of said driver inputs; and means responsive to the disconnection of said connector means for applying a signal to the input of one of said drivers.

5. The combination as claimed in claim 4, wherein said disconnection responsive means includes a transistor coupled to the input of one of said drivers, said transistor being maintained in the "off" condition by means of a signal line coupled from the electronic control system through said connector means and said transistor being enabled and suitable for generating an enabling signal to the input of the driver to which it is coupled when the connector means are disconnected.

6. The combination as claimed in claim 5, wherein each of said drivers includes a transistor having its base coupled to one of said driver inputs and its collector coupled to one of said driver outputs.

7. The combination as claimed in claim 6, wherein said disconnection responsive means transistor has its collector to emitter path coupled to the base of one of said driver transistors and its base connected to said signal line by means of said connector means; and wherein said disconnection responsive means transistor when conducting causes said one driver transistor to conduct.

8. The combination as claimed in claim 6, wherein said electronic control system including said sequencing means are placed on a first board;

wherein said plurality of drivers including said disconnection responsive means are placed on another board;

wherein the two boards are interconnected by said connector means; and wherein said disconnection responsive means are activated when said first board is removed from the receiver.

* * * * *

UNITED STATES PATENT OFFICE

CERTIFICATE OF CORRECTION

Patent No. 3,662,270 Dated May 9, 1972

Inventor(s) Wayne Wheeler Evans

It is certified that error appears in the above-identified patent and that said Letters Patent are hereby corrected as shown below:

In Column 2, line 75, delete "$\bar{Q}$" and substitute therefor -- Q --. Column 3, line 2, delete "fliplflop" and substitute therefor -- flip-flop --; line 11, delete "Q" and substitute therefor -- $\bar{Q}$ --. Column 4, line 31, delete "drives" and substitute therefor -- drivers --.

Signed and sealed this 12th day of December 1972.

(SEAL)
Attest:

EDWARD M.FLETCHER,JR.
Attesting Officer

ROBERT GOTTSCHALK
Commissioner of Patents